United States Patent
Hata et al.

(10) Patent No.: US 10,168,842 B2
(45) Date of Patent: Jan. 1, 2019

(54) CONDUCTIVE SUBSTRATE, CONDUCTIVE SUBSTRATE LAMINATE, METHOD FOR PRODUCING CONDUCTIVE SUBSTRATE, AND METHOD FOR PRODUCING CONDUCTIVE SUBSTRATE LAMINATE

(71) Applicant: SUMITOMO METAL MINING CO., LTD., Tokyo (JP)

(72) Inventors: Hiroki Hata, Niihama (JP); Daiki Shiga, Niihama (JP); Takahiro Suda, Niihama (JP); Yoshihide Nishiyama, Niihama (JP)

(73) Assignee: SUMITOMO METAL MINING CO., LTD., Tokyo (JP)

(*) Notice: Subject to any disclaimer, the term of this patent is extended or adjusted under 35 U.S.C. 154(b) by 0 days.

(21) Appl. No.: 15/114,591

(22) PCT Filed: Jan. 29, 2015

(86) PCT No.: PCT/JP2015/052474
§ 371 (c)(1),
(2) Date: Jul. 27, 2016

(87) PCT Pub. No.: WO2015/115528
PCT Pub. Date: Aug. 6, 2015

(65) Prior Publication Data
US 2016/0342242 A1    Nov. 24, 2016

(30) Foreign Application Priority Data

Jan. 31, 2014  (JP) ................. 2014-017974
Aug. 29, 2014  (JP) ................. 2014-176208

(51) Int. Cl.
*G06F 3/044*    (2006.01)
*C22C 19/03*    (2006.01)
(Continued)

(52) U.S. Cl.
CPC .............. *G06F 3/044* (2013.01); *C22C 19/03* (2013.01); *C22C 19/05* (2013.01); *C22C 19/058* (2013.01);
(Continued)

(58) Field of Classification Search
CPC .................... H01L 24/03; G06F 3/044; G06F 2203/04112; G06F 2203/04103; G02F 1/13338; H05K 1/0274
See application file for complete search history.

(56) References Cited

U.S. PATENT DOCUMENTS

2006/0172127 A1   8/2006   Nagayama et al.
2009/0104572 A1   4/2009   Gao et al.
(Continued)

FOREIGN PATENT DOCUMENTS

CN   103460303 A   12/2013
JP   10-307204 A   11/1998
(Continued)

OTHER PUBLICATIONS

International Search Report dated Apr. 21, 2015, issued for PCT/JP2015/052474.

*Primary Examiner* — Robert Michaud
(74) *Attorney, Agent, or Firm* — Locke Lord LLP

(57) ABSTRACT

A conductive substrate includes a transparent base material; a metal layer formed on at least one of surfaces of the transparent base material; and a blackened layer formed on the metal layer by a wet method.

8 Claims, 4 Drawing Sheets

(51) Int. Cl.
  *C22C 19/05* (2006.01)
  *H05K 1/02* (2006.01)
  *H05K 1/14* (2006.01)
  *H05K 3/06* (2006.01)
  *H05K 3/46* (2006.01)
  *C23C 18/54* (2006.01)
  *C23C 22/68* (2006.01)
  *C23C 28/00* (2006.01)
  *C25D 3/38* (2006.01)
  *C25D 5/48* (2006.01)

(52) U.S. Cl.
  CPC ............ *C23C 18/54* (2013.01); *C23C 22/68* (2013.01); *C23C 28/32* (2013.01); *C23C 28/345* (2013.01); *C23C 28/40* (2013.01); *H05K 1/0274* (2013.01); *H05K 1/144* (2013.01); *H05K 3/06* (2013.01); *H05K 3/4611* (2013.01); *C25D 3/38* (2013.01); *C25D 5/48* (2013.01); *G06F 2203/04103* (2013.01); *G06F 2203/04112* (2013.01)

(56) References Cited

U.S. PATENT DOCUMENTS

| | | | |
|---|---|---|---|
| 2013/0293482 | A1* | 11/2013 | Burns ............... B81B 7/0006 345/173 |
| 2014/0016278 | A1 | 1/2014 | Hwang et al. |
| 2015/0177876 | A1* | 6/2015 | Ishii .................. G06F 3/044 345/174 |

FOREIGN PATENT DOCUMENTS

| | | |
|---|---|---|
| JP | 2003-151358 A | 5/2003 |
| JP | 2011-018194 A | 1/2011 |
| JP | 2012-094115 A | 5/2012 |
| JP | 2012-206307 A | 10/2012 |
| JP | 2013-069261 A | 4/2013 |
| JP | 2013110231 A | 6/2013 |
| JP | 2013-169712 A | 9/2013 |
| TW | 201224903 A | 6/2012 |
| WO | 2005031681 A1 | 4/2005 |
| WO | WO-2014/010620 A | 1/2014 |

\* cited by examiner

CONDUCTIVE SUBSTRATE, CONDUCTIVE SUBSTRATE LAMINATE, METHOD FOR PRODUCING CONDUCTIVE SUBSTRATE, AND METHOD FOR PRODUCING CONDUCTIVE SUBSTRATE LAMINATE

TECHNICAL FIELD

The present invention relates to a conductive substrate, a conductive substrate laminate, a method for producing a conductive substrate, and a method for producing a conductive substrate laminate.

BACKGROUND ART

An electrostatic-capacitance-type touch panel detects change of an electrostatic capacitance induced by an object approaching the panel surface, and converts information about the position of the approaching object on the panel surface into an electric signal. Since a conductive substrate used for such an electrostatic-capacitance-type touch panel is installed on the surface of a display, a wiring material of the conductive substrate needs to have a low reflectance and a low visibility.

Thereupon, as a wiring material used for an electrostatic-capacitance-type touch panel, a material having a low reflectance and a low visibility is used, and the wiring is formed on a transparent substrate or a transparent film. For example, Patent Document 1 discloses a transparent conductive film for a touch panel that has an ITO (indium tin oxide) film formed as a transparent conductive film on a high-polymer film.

In recent years, displays having touch panels have been becoming larger, and hence, larger areas have been desired for conductive substrates such as transparent conductive films and the like for touch panels. However, ITO has a high electrical resistance that causes degradation of a signal, and hence, has a problem that it is not suitable for a larger panel.

Therefore, for example, as disclosed in Patent Documents 2 and 3, ideas have been considered that use metal foils such as copper films and the like instead of an ITO film. However, for example, if copper is used in a metal layer, there is a problem that metallic luster of copper reduces visibility of a display due to glitter caused by reflected light.

Thereupon, a conductive substrate has been considered that has a metal layer constituted with a metal foil such as copper film or the like, and in addition, has a blackened layer formed to prevent reflection of light on the surface of the metal layer.

RELATED-ART DOCUMENTS

Patent Documents

[Patent Document 1] Japan country Japanese Laid-open Patent Publication No. 2003-151358
[Patent Document 2] Japan country Japanese Laid-open Patent Publication No. 2011-018194
[Patent Document 3] Japan country Japanese Laid-open Patent Publication No. 2013-069261

SUMMARY OF THE INVENTION

Problem to be Solved by Invention

However, conventional blackened layers, formed as films by a dry method, need time to form a blackened layer having a film thickness that can sufficiently prevent metallic luster of a metal layer constituted with a metal foil, and this causes a problem of low productivity.

In view of the above problems of the conventional technology, it is an object of the present invention to provide a conductive substrate that can prevent reflection of light on the surface of the metal layer, and can be manufactured with high productivity.

Means to Solve the Problem

To solve the above problems, the present invention provides a conductive substrate that includes a transparent base material; a metal layer formed on at least one of surfaces of the transparent base material; and a blackened layer formed on the metal layer by a wet method.

Advantage of the Invention

According to the present invention, it is possible to provide a conductive substrate that can prevent reflection of light on the surface of the metal layer, and can be manufactured with high productivity.

MODE FOR CARRYING OUT THE INVENTION

Figure 1A:
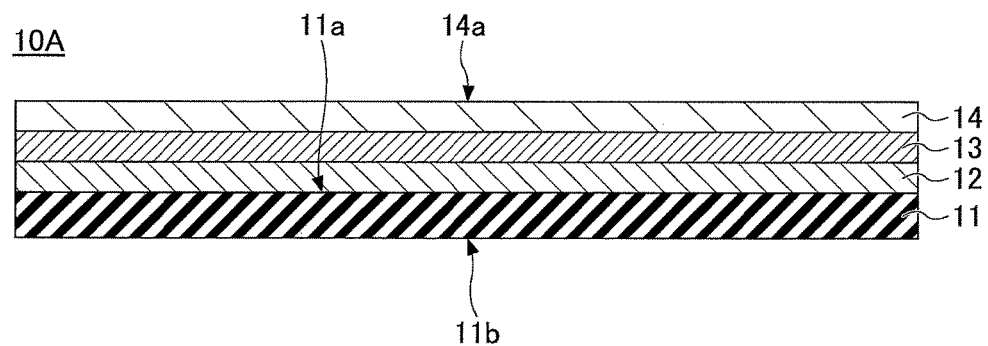
FIG. 1A is a cross-sectional view of a conductive substrate according to an embodiment of the present invention.

In the following, a conductive substrate, a conductive substrate laminate, a method for producing a conductive substrate, and a method for producing a conductive substrate laminate will be described according to an embodiment of the present invention.
(Conductive Substrate)

A conductive substrate of the embodiment may include a transparent base material, a metal layer formed on at least one of surfaces of the transparent base material, and a blackened layer formed on the metal layer by a wet method.

Note that the conductive substrate in the embodiment includes a substrate that has a metal layer and a blackened layer on the surface of a transparent base material before forming patterns on the metal layer and the like, and a substrate that has the metal layer and the like having patterns formed, namely, a wiring substrate. Also, a substrate that has the metal layer and the like having patterns formed, is a transparent conductive substrate because the transparent base material includes a region that is not covered by the metal layer and the like, through which light can transmit.

Here, first, members included in the conductive substrate will be described in the following.

The transparent base material is not limited specifically, and may preferably be a resin substrate (a resin film), a glass substrate or the like that transmits visible light.

As a material of a resin substrate that transmits visible light, for example, resin such as a polyamide resin, a polyethylene-terephthalate resin, a polyethylene-naphthalate resin, a cycloolefin resin, a polyimide resin and the like, may be preferably used. Especially, as a material of a resin substrate that transmits visible light, PET (polyethylene-terephthalate), COP (cycloolefin polymer), PEN (polyethylene-naphthalate), polyimide, polycarbonate or the like may be further preferably used.

The thickness of the transparent base material is not limited specifically, and may be selected discretionarily depending on the strength, electrostatic capacitance, light transmittance and the like that are required for the conductive substrate. The thickness of the transparent base material may be set to, for example, greater than or equal to 10 µm and less than or equal to 200 µm. Especially, when used for an application of a touch panel, it is preferable that the thickness of the transparent base material is greater than or equal to 20 µm and less than or equal to 120 µm, and further preferable that it is greater than or equal to 20 µm and less than or equal to 100 µm. When used for an application of a touch panel, for example, especially for an application in which the thickness of an entire display needs to be thin, it is preferable that the thickness of the transparent base material is greater than or equal to 20 µm and less than or equal to 50 µm.

It is preferable that the total transmittance of the transparent base material has a high value, for example, it is preferable that the total transmittance is greater than or equal to 30%, and further preferable that it is greater than or equal to 60%. By having the total transmittance of the transparent base material fall within the range, for example, when used for an application of a touch panel, the visibility of the display can be sufficiently secured.

Note that the total transmittance of the transparent base material can be evaluated by a method specified in JIS K 7361-1.

Next, a metal layer will be described.

A material to constitute a metal layer is not limited specifically, and a material having the electrical conductivity suitable for an application can be selected. It is preferable that the material is, for example, a copper alloy constituted with Cu and at least one of metals selected among Ni, Mo, Ta, Ti, V, Cr, Fe, Mn, Co, and W, or a material including copper. Also, the metal layer may be a copper layer constituted with copper.

Although a method for forming the metal layer on the transparent base material is not limited specifically, it is preferable that an adhesive is not placed between the transparent base material and the metal layer so as not to reduce the transmittance of light. In other words, it is preferable that the metal layer is formed directly on at least one of the surfaces of the transparent base material. Note that in a case where an adhesion layer is placed between the transparent base material and the metal layer as will be described later, it is preferable that the metal layer is formed directly on the upper surface of the adhesion layer.

To form the metal layer directly on the upper surface of the transparent base material, it is preferable that the metal layer has a metal thin film layer. Also, the metal layer may have a metal thin film layer and a metal plated layer.

A metal thin film layer may be formed, for example, on the transparent base material by dry plating, and the metal thin film layer can be treated as the metal layer. This makes it possible to form the metal layer directly on the transparent base material without having an adhesive in-between. Note that as a method for dry plating, for example, sputtering, vapor deposition, ion plating, or the like may be preferably used. Especially, it is further preferable to use sputtering because the film thickness can be controlled easily.

Also, in a case where the film thickness of the metal layer needs to be thick, the metal layer may have a metal thin film layer and a metal plated layer, by using the metal thin film layer as a power feeding layer, and forming the metal plated layer by electroplating, which is a kind of wet plating. By forming the metal layer to have the metal thin film layer and the metal plated layer, this case also makes it possible to form the metal layer directly on the transparent base material without having an adhesive in-between.

The thickness of the metal layer is not limited specifically, and in a case where the metal layer is used as wiring, the thickness can be selected discretionarily depending on the magnitude of a current supplied to the wiring, the wiring width and the like.

However, if the metal layer is thick, etching to form a wiring pattern takes time, and problems may arise such that side etch tends to be generated, thin lines may be difficult to form, and the like. Therefore, it is preferable that the thickness of the metal layer is less than or equal to 5 µm, and further preferable that the thickness is less than or equal to 3 µm.

Also, especially from the viewpoint of decreasing the resistance value of the conductive substrate to supply the current sufficiently, for example, it is preferable that the metal layer has the thickness greater than or equal to 50 nm, further preferable greater than or equal to 60 nm, and even further preferable greater than or equal to 150 nm.

Note that in a case where the metal layer has a metal thin film layer and a metal plated layer as described above, it is preferable that the sum of the thickness of the metal thin film layer, and the thickness of the metal plated layer is within the above range. Also, as will be described later, in a case where a wet process or electroless plating is applied to the metal layer, to make a part of the formed metal layer be the blackened layer, the thickness of the metal layer excluding the blackened layer is the thickness of the metal layer here.

As will be described later, the metal layer can be used as wiring, for example, by patterning with a desired wiring pattern. Further, since the metal layer can decrease the electrical resistance value lower than ITO that has been used as a conventional transparent conductive film, providing the metal layer can decrease the electrical resistance value of the conductive substrate or the transparent conductive substrate.

Next, a blackened layer will be described.

The blackened layer may be formed on the upper surface of the metal layer.

Especially, it is preferable that the blackened layer is formed on the entire upper surface of the metal layer. In other words, it is preferable that the blackened layer is formed so as to cover the upper surface of the metal layer.

Note that the upper surface of the metal layer means a surface of the metal layer opposite to another surface that faces the transparent base material.

The blackened layer may be formed by a wet method.

As described above, in a conventional conductive substrate, the blackened layer has been formed by dry plating. In contrast to this, in the conductive substrate according to the embodiment, the blackened layer is formed by a wet method so that the blackened layer can be formed as a film in a shorter time than by dry plating, and productivity can be increased. Also, providing the blackened layer can securely prevent reflection of light on the surface of the metal layer.

A method for forming the blackened layer is not specifically limited as long as it is a wet method, for example, a method may be considered that newly forms and stacks a blackened layer on the metal layer by wet plating. As the wet plating in this case, for example, electrolytic plating may be used.

In a case where the blackened layer is newly stacked on the upper surface of the metal layer by wet plating, it is preferable that the blackened layer includes, for example, at least one metal selected among Ni, Zn, Mo, Ta, Ti, V, Cr, Fe, Co, W, Cu, Sn, and Mn. Also, the blackened layer may further include one or more elements selected among carbon, oxygen, and nitrogen.

Note that the blackened layer may include a metal alloy that includes at least two metals selected among Ni, Zn, Mo, Ta, Ti, V, Cr, Fe, Co, W, Cu, Sn, and Mn. Also in this case, the blackened layer may further include one or more elements selected among carbon, oxygen, and nitrogen. As the metal alloy that includes at least two metals selected among Ni, Zn, Mo, Ta, Ti, V, Cr, Fe, Co, W, Cu, Sn, and Mn used for this case, for example, Ni—Cu alloy, Ni—Zn alloy, Ni—Ti alloy, Ni—W alloy, Ni—Cr alloy, or Ni—Cu—Cr alloy may be preferably used.

Note that in a case where an adhesion layer is provided as will be described later, the adhesion layer and the blackened layer may be constituted with the same materials, or may be constituted with different materials. However, since patterning may be performed on the adhesion layer, the metal layer, and the blackened layer by etching, it is preferable that the adhesion layer, the metal layer, and the blackened layer have nearly the same reactivity to etching liquid, and it is further preferable that the reactivity is the same. Therefore, it is especially preferable that the adhesion layer and the blackened layer are constituted with the same material.

Also, as a specific method for forming the blackened layer by a wet method, a method may be considered that forms the blackened layer by applying a blackening process to the surface of the formed metal layer by chemical liquid (a wet process). In other words, the chemical liquid is supplied to the upper surface of the metal layer, to have the metal layer and the chemical liquid react, and to make a part of the metal layer be the blackened layer. Although a method for supplying the chemical liquid on the upper surface of the metal layer is not limited specifically, one may consider, for example, a method that immerses a part of the metal layer into the chemical liquid, a method that applies or sprays the chemical liquid on the upper surface of the metal layer, or the like.

Although the type of the chemical liquid supplied to the upper surface of the metal layer is not limited specifically, for example, chemical liquid that is capable of applying a sulfuration process to the metal layer may be used. As the chemical liquid applying a sulfuration process to the metal layer, for example, a mixed solution of potassium sulfide or potassium polysulfide, and ammonium chloride may be preferably used.

Also, as a specific method for forming the blackened layer by a wet method, a method may be considered that forms the blackened layer by applying electroless plating on the surface of the formed metal layer.

The electroless plating here is a method for plating that uses a phenomenon in which when the metal layer is immersed into plating solution that includes metal ions nobler than the metal of the metal layer in terms of the standard electrode potential, the metal of the metal layer is dissolved into the plating solution, and instead of that, the nobler metal ions in the solution are reduced and precipitated on the surface of the metal layer.

In a case where the blackened layer is formed by electroless plating, the materials of the blackened layer are not limited specifically, but it is preferable that the blackened layer contains, for example, tellurium chloride.

Also, the blackened layer may be constituted with tellurium chloride. In other words, the blackened layer may be a tellurium chloride layer.

Note that the blackened layer may be formed after patterning has been done on the adhesion layer and the metal layer as will be described later. In this case, the blackened layer may be formed not only on the upper surface of the metal layer, but also on the side surfaces.

The thickness of the blackened layer is not limited specifically, but it is preferable to be, for example, greater than or equal to 15 nm, and further preferable to be greater than or equal to 25 nm. This is because if the blackened layer is thin, reflection of light on the surface of the metal layer may not be prevented sufficiently. On the other hand, if the thickness of the blackened layer is greater than or equal to 15 nm as described above, a preferable configuration can be obtained in which reflection of light on the surface of the metal layer can be especially prevented.

Although the upper limit value of the thickness of the blackened layer is not limited specifically, if it is thicker than necessary, time required for forming the film and time required for etching to form wiring become longer, and the cost increases. Therefore, it is preferable that the thickness of the blackened layer is less than or equal to 70 nm, and further preferable less than or equal to 50 nm.

Also, in the conductive substrate according to the embodiment, an optional layer may be further provided. For example, an adhesion layer may be provided.

A configuration example of an adhesion layer will be described.

As described above, although the metal layer may be formed on the transparent base material, if the metal layer is directly formed on the transparent base material, adhesion between the transparent base material and the metal layer may not be sufficient. Therefore, if the metal layer is formed directly on the upper surface of the transparent base material, the metal layer may be delaminated from the transparent base material during the manufacturing process or actual use.

Thereupon, in the conductive substrate according to the embodiment, to make the adhesion between the transparent base material and the metal layer higher, an adhesion layer may be formed on at least one of the principal planes of the transparent base material. Also, it is possible to form adhesion layers on both the principal planes of the transparent base material as will be described later.

By placing an adhesion layer between the transparent base material and the metal layer, the adhesion between the transparent base material and the metal layer can be increased, and delamination of the metal layer from the transparent base material can be prevented.

Also, as has already been described, the metal layer can be formed of, for example, copper or a copper alloy, and has metallic luster. Therefore, just by placing the metal layer on the transparent base material, light from the side of the transparent base material is reflected on the surface of the metal layer, and if the conductive substrate is used, for example, for a touch panel, glitter due to the reflected light may decrease the visibility on the display.

Thereupon, since the adhesion layer can function also as the blackened layer, by placing the adhesion layer functioning as the blackened layer between the transparent base material and the metal layer, it is possible to prevent reflection of light on the surface of the metal layer, especially for the light from the side of the lower surface of the metal layer, namely, the side of the transparent base material.

The materials of the adhesion layer are not limited specifically, and can be selected discretionarily depending on adhesion force between the transparent base material and the metal layer, a degree of preventing reflection of light on the surface of the metal layer, stability of the environment (for example, humidity and temperature) in which the conductive substrate is used, and the like.

It is preferable that the adhesion layer includes at least one metal selected among, for example, Ni, Zn, Mo, Ta, Ti, V, Cr, Fe, Co, W, Cu, Sn, and Mn. Also, the adhesion layer may further include one or more elements selected among carbon, oxygen, and nitrogen.

Note that the adhesion layer may include a metal alloy that includes at least two metals selected among Ni, Zn, Mo, Ta, Ti, V, Cr, Fe, Co, W, Cu, Sn, and Mn. Also in this case, the adhesion layer may further include one or more elements selected among carbon, oxygen, and nitrogen.

As the metal alloy that includes at least two metals selected among Ni, Zn, Mo, Ta, Ti, V, Cr, Fe, Co, W, Cu, Sn, and Mn used for this case, for example, Ni—Cu alloy, Ni—Zn alloy, Ni—Ti alloy, Ni—W alloy, Ni—Cr alloy, or Ni—Cu—Cr alloy may be preferably used.

Especially, in a case where reflection of light on the surface of the metal layer is prevented by the adhesion layer, namely, in a case where the adhesion layer functions as the blackened layer, it is preferable that the adhesion layer includes Ni—Cu alloy or Ni—Cu—Cr alloy. Also in this case, the adhesion layer may further include one or more elements selected among carbon, oxygen, and nitrogen.

Although a method for forming a film of the adhesion layer is not limited specifically, it is preferable to form the film by dry plating. As dry plating, for example, sputtering, vapor deposition, ion plating, or the like may be preferably used. Especially, sputtering may be further preferably used because the film thickness can be controlled easily.

Note that if the adhesion layer includes one or more elements selected among carbon, oxygen, and nitrogen, the elements can be added into the adhesion layer, by adding gas that contains the one or more elements selected among carbon, oxygen, and nitrogen, to the atmosphere used when forming the adhesion layer as a film. For example, if adding carbon into the adhesion layer, carbon monoxide gas or carbon dioxide gas may be added; if adding nitrogen, nitrogen gas may be added; or if adding oxygen, oxygen gas may be added, to the atmosphere used when applying the dry plating.

It is preferable that the gas containing one or more elements selected among carbon, oxygen, and nitrogen is added to an inert gas, and to be used as the atmospheric gas for dry plating. The inert gas is not limited specifically, for example, argon may be preferably used.

By forming the adhesion layer as a film by dry plating as described above, the adhesion between the transparent base material and the adhesion layer can be increased. In addition, since the adhesion layer may include, for example, metal as a principal element, the adhesion with the metal layer can be high. Therefore, by placing the adhesion layer between the transparent base material and the metal layer, delamination of the metal layer can be prevented.

Although the thickness of the adhesion layer is not limited specifically, it is preferable to be, for example, greater than or equal to 3 nm and less than or equal to 50 nm, further preferable to be greater than or equal to 3 nm and less than or equal to 35 nm, and even further preferable to be greater than or equal to 3 nm and less than or equal to 33 nm.

In a case where the adhesion layer also functions as the blackened layer, namely, in a case where the adhesion layer prevents reflection of light on the surface of the metal layer, it is preferable that the thickness of the adhesion layer is greater than or equal to 3 nm as described above.

Although the upper limit value of the thickness of the adhesion layer is not limited specifically, if it is thicker than necessary, time required for forming the film and time required for etching to form wiring become longer, and the cost increases. Therefore, it is preferable that the thickness of the adhesion layer is less than or equal to 50 nm, further preferable less than or equal to 35 nm, and even further preferable less than or equal to 33 nm.

Next, configuration examples of the conductive substrate will be described.

As described above, the conductive substrate according to the embodiment may have a configuration that includes the transparent base material, the metal layer, and the blackened layer, and the metal layer and the blackened layer are stacked on the transparent base material in this order. Also, in a case where an adhesion layer is provided, it is configured to have the adhesion layer, the metal layer, and the blackened layer stacked on the transparent base material in this order.

Figure 1B:
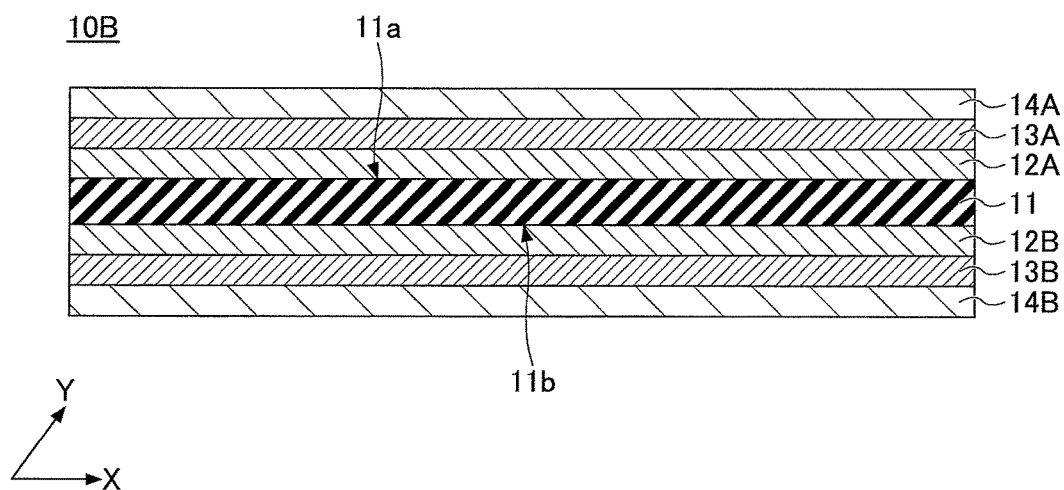
FIG. 1B is a cross-sectional view of a conductive substrate according to an embodiment of the present invention.

Specific configuration examples will be described in the following using FIG. 1A and FIG. 1B. FIG. 1A and FIG. 1B illustrate examples of cross-sectional views of the conductive substrates according to the embodiment on a surface parallel with the stacking direction of the transparent base material, the adhesion layer, the metal layer, and the blackened layer.

For example, as shown by a conductive substrate 10A in FIG. 1A, a configuration is possible in which an adhesion layer 12, a metal layer 13, and a blackened layer 14 are stacked on the side of a first principal plane 11a of a transparent base material 11, layer by layer in this order. Also, as shown by a conductive substrate 10B in FIG. 1B, it is possible to have adhesion layers 12A and 12B, metal layers 13A and 13B, and blackened layers 14A and 14B stacked on the side of a first principal plane 11a, and on the side of a second principal plane 11b of a transparent base material 11, respectively, layer by layer in this order.

Note that the adhesion layers 12 (12A, 12B) are optional layers as described above, and if the adhesion layers 12 (12A, 12B) are not provided, the metal layers 13 (13A, 13B) are directly formed on the transparent base material 11.

The conductive substrate according to the embodiment can be used for various applications, for example, for a touch panel. When used for various applications, it is preferable that the metal layer and the blackened layer included in the conductive substrate according to the embodiment have patterns. The metal layer and the blackened layer can be patterned, for example, to have desired wiring patterns, and it is preferable that the metal layer and the blackened layer are patterned to have the same pattern.

Note that in a case where the adhesion layer is provided as described above, it is preferable that the adhesion layer is also patterned, and can be patterned to have a desired wiring pattern as done for the metal layer and the like. In this case, it is preferable that the adhesion layer is patterned to have the same pattern as the metal layer and the like.

In the conductive substrate according to the embodiment, the metal layer 13 (13A, 13B) and the blackened layer 14 (14A, 14B) are stacked on the transparent base material 11 as described above. Therefore, on the surface of the metal layer 13 (13A, 13B) having the blackened layer 14 (14A, 14B) formed, reflection of light can be prevented.

Also, in the conductive substrates 10A and 10B shown in FIG. 1A and FIG. 1B, respectively, the adhesion layer 12 (12A, 12B) is placed between the transparent base material 11 and the metal layer 13 (13A, 13B). Therefore, adhesion between the transparent base material 11 and the metal layer 13 (13A, 13B) can be increased. Also, in a case where the adhesion layer 12 (12A, 12B) is constituted with a material that can function as the blackened layer, it is possible to prevent reflection of light from the lower surface of the metal layer 13 (13A, 13B), namely, from the side of the transparent base material 11, on the surface of the metal layer 13 (13A, 13B).

Although the degree of reflection of light of the conductive substrate according to the embodiment is not limited specifically, it is preferable that the reflectance (specular reflectance) of light having a wavelength, for example, greater than or equal to 400 nm and less than or equal to 800 nm, is less than 30%, and further preferable less than 20%, and especially preferable less than 10%. In a case where the reflectance of light having a wavelength greater than or equal to 400 nm and less than or equal to 800 nm, is less than 30%, and if the conductive substrate is used for a touch panel, visibility of the display hardly decreases, and this is preferable.

Measurement of the reflectance may be performed by illuminating light on the blackened layer 14 (14A, 14B).

Specifically, for example, as shown in FIG. 1A, in a case where the blackened layer 14, the adhesion layer 12, the metal layer 13, and the blackened layer 14 are stacked in this order on the side of the first principal plane 11a of the transparent base material 11, the reflectance can be measured by illuminating light on a surface 14a of the blackened layer 14 from the above so that light illuminates on the blackened layer 14. For this measurement, the wavelength of light may be varied in a range greater than or equal to 400 nm and less than or equal to 800 nm by a wavelength interval of, for example, 1 nm, for illumination on the blackened layer of the conductive substrate as described above, and the average value of the measured values can be taken as the reflectance of the conductive substrate.

Note that in a case where an adhesion layer is formed that functions as a blackened layer, the reflectance on the side where the adhesion layer 12 is provided can be measured by illuminating light on the side of the second principal plane 11b of the transparent base material so that light illuminates on the adhesion layer 12.

For the conductive substrate according to the embodiment, it is preferable that the reflectance of light measured on the surface of the blackened layer is within the above range. Also, in a case where an adhesion layer is formed that functions as a blackened layer, it is preferable that the reflectance of light is within the above range on both the surface of the adhesion layer and the surface of the blackened layer.

Also, by providing the metal layer in the conductive substrate according to the embodiment as described above, the surface resistivity of the conductive substrate can be decreased. It is preferable that the surface resistivity is less than 0.2 Ω/□, and further preferable less than 0.15 Ω/□.

Although the measurement method for the surface resistivity is not limited specifically, it may be measured, for example, by four-probe probing, and it is preferable to perform the measurement by having the probes contact the surface of the conductive substrate, namely, the blackened layer.

So far, the conductive substrate according to the embodiment has been described. Further, two or more of the conductive substrates may be stacked to form a conductive substrate laminate. In a case where the conductive substrates are stacked, it is preferable that the metal layer, the blackened layer, and the adhesion layer if necessary, included in each of the conductive substrates have patterns as described above.

Especially to be used for an application of a touch panel, it is preferable that the conductive substrate or the conductive substrate laminate provides meshed wiring as will be described later.

Here, an example case is taken in which two conductive substrates are stacked to form a conductive substrate laminate having meshed wiring, and a configuration example of pattern shapes of the metal layer and the blackened layer constituting a conductive substrate before stacking, will be described using FIG. 2A and FIG. 2B. Note that FIG. 2B illustrates an example in which an adhesion layer is formed between the transparent base material and the metal layer.

Figure 2A:
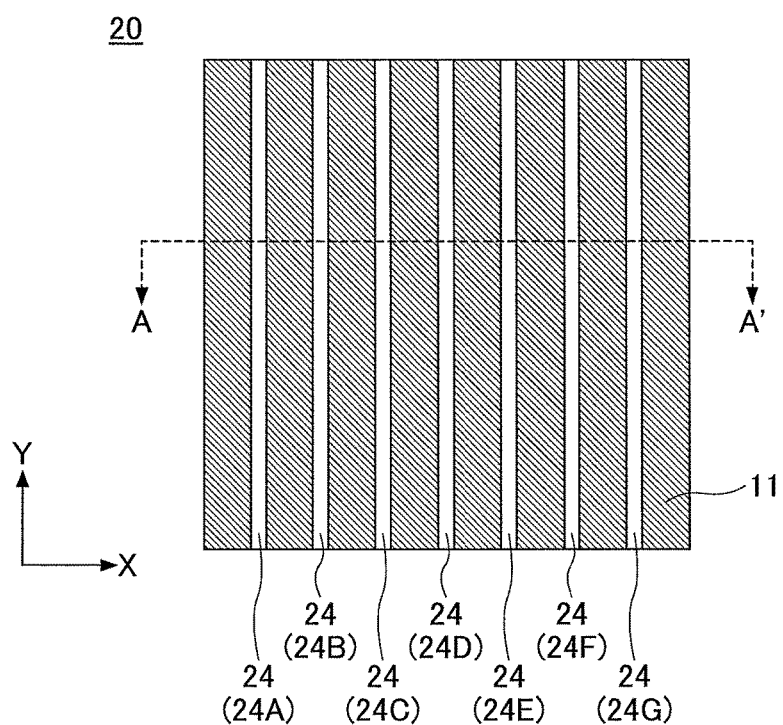
FIG. 2A is a diagram that illustrates a configuration of a conductive substrate having a pattern formed according to an embodiment of the present invention.

FIG. 2A is a diagram of one of two conductive substrates that constitute a conductive substrate laminate having meshed wiring, viewing from the upper surface side of a conductive substrate 20, namely, in a direction vertical to the principal plane of the transparent base material 11. Also, FIG. 2B is a cross-sectional view of FIG. 2A taken along the line A-A'.

Figure 2B:
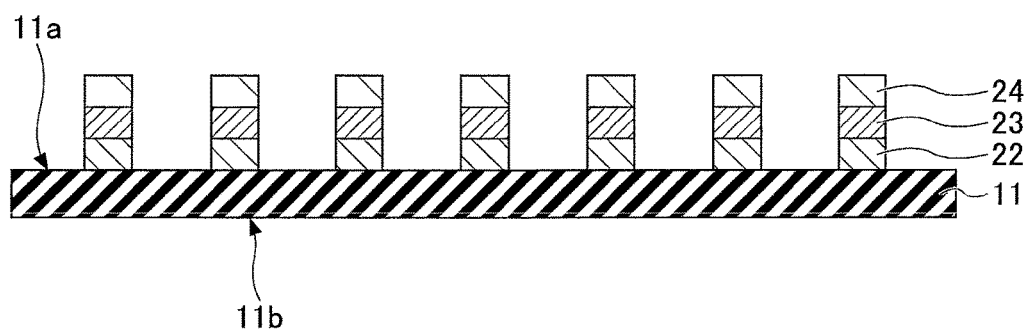
FIG. 2B is a cross-sectional view of FIG. 2A taken along the line A-A'.

As shown in FIG. 2A and FIG. 2B, an adhesion layer 22, a metal layer 23, and a blackened layer 24 that are patterned on the transparent base material 11 in the conductive substrate 20 have the same shape. For example, the patterned blackened layer 24 has a pattern of multiple straight lines shown in FIG. 2A (patterned lines 24A-24G of the blackened layer), these straight lines in the pattern can be placed in parallel with the Y-axis in the figure, and separated from each other in the X-axis direction in the figure. In this case, if the transparent base material 11 has a quadrilateral shape as shown in FIG. 2A, it is preferable that the pattern of the blackened layer (patterned lines 24A-24G of the blackened layer) is placed in parallel with one side of the transparent base material 11.

Note that, as described above, the patterned metal layer 23 has the same pattern as the patterned blackened layer 24, which is the pattern of multiple straight lines (the metal layer pattern), and these patterned lines are placed in parallel with and separated from each other. This is the same for the patterned adhesion layer 22. Therefore, the first principal plane 11a of the transparent base material 11 is exposed through the space between the patterned lines.

A method for forming the patterns of the patterned adhesion layer 22, the metal layer 23, and the blackened layer 24 shown in FIG. 2A and FIG. 2B is not limited to specifically. For example, after the blackened layer 24 has been formed, by placing a mask that has a shape corresponding to the pattern to be formed on the blackened layer 24, and then, the pattern can be formed by etching. Etching liquid to be used is not limited specifically, and can be selected discretionarily depending on the materials forming the adhesion layer, the metal layer, and the blackened layer. For example, etching liquid can be changed layer by layer, or the same etching liquid can be used for etching the adhesion layer, the metal layer, and the blackened layer at the same time.

Figure 3A:
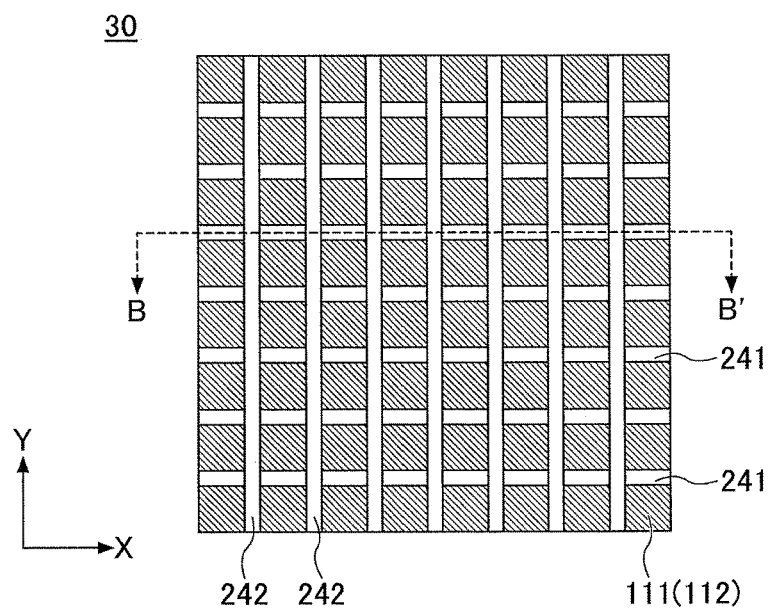
FIG. 3A is a diagram that illustrates a configuration of a conductive substrate laminate having meshed wiring according to an embodiment of the present invention.

Then, by stacking two conductive substrates that have the metal layer and the blackened layer patterned, possibly with the adhesion layer patterned, a conductive substrate laminate can be formed. The conductive substrate laminate will be described using FIG. 3A and FIG. 3B. FIG. 3A illustrates a conductive substrate laminate 30, viewing from the upper surface side, namely, from the upper surface side in the stacking direction of two conductive substrates, and FIG. 3B is a cross-sectional view of FIG. 3A taken along the line B-B'.

Figure 3B:
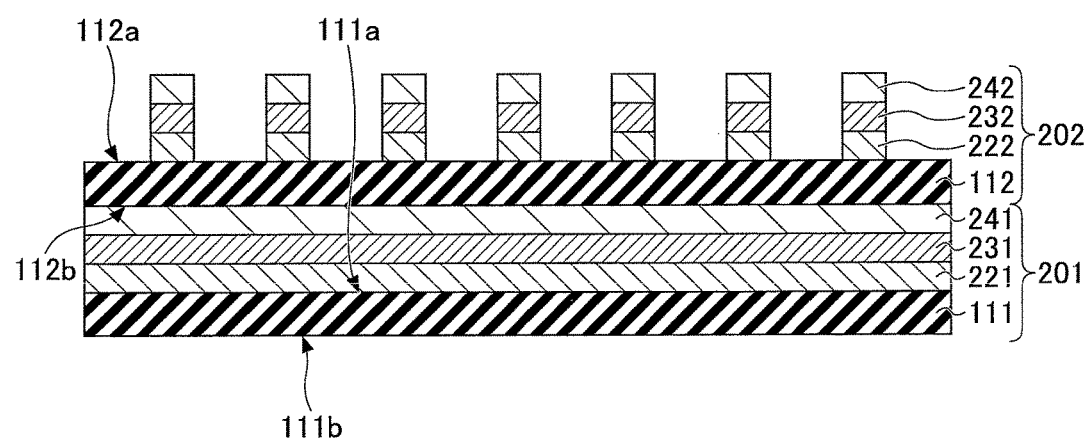
FIG. 3B is a cross-sectional view of FIG. 3A taken along the line B-B'.

As shown in FIG. 3B, the conductive substrate laminate 30 is obtained by stacking a conductive substrate 201 and a conductive substrate 202. Note that the conductive substrate 201 (202) has a patterned adhesion layer 221 (222), a metal layer 231 (232), and a blackened layer 241 (242) stacked on the transparent base material 111 (112). The patterned adhesion layer 221 (222), metal layer 231 (232), and blackened layer 241 (242) of the conductive substrate 201 (202) are patterned to have the pattern of multiple straight lines as in the conductive substrate 20 described above.

In addition, they are stacked so that a first principal plane 111a of the transparent base material 111 of the conductive substrate 201 faces a second principal plane 112b of the transparent base material 112 of the conductive substrate 202.

Note that the conductive substrate 201 may be set upside down so that a second principal plane 111b of the transparent base material 111 of the conductive substrate 201 faces the second principal plane 112b of the transparent base material 112 of the conductive substrate 202 in the stack. This case has a placement that is the same as in FIG. 4, which will be described later.

The two conductive substrates may be stacked, as shown in FIG. 3A and FIG. 3B, so as to have the patterned metal layer 231 of the conductive substrate 201 cross the patterned metal layer 232 of the conductive substrate 202. Specifically, for example, in FIG. 3A, the patterned metal layer 231 of the conductive substrate 201 may be placed so that the longitudinal direction of the pattern is parallel with the X-axis direction in the figure. Then, the patterned metal layer 232 of the conductive substrate 202 may be placed so that the longitudinal direction of the pattern is parallel with the Y-axis direction in the figure.

Note that as described above, since FIG. 3A is a diagram that views the conductive substrate laminate 30 in the stacking direction, the patterned blackened layers 241 and 242 are shown that are placed the most upper parts of the conductive substrates 201 and 202, respectively. Since the patterned metal layers 231 and 232 have the same patterns as the patterned blackened layers 241 and 242, respectively, the patterned metal layers 231 and 232 have the meshed shapes, similar to those of the patterned blackened layers 241 and 242.

A bonding method for two conductive substrates to be stacked is not limited specifically, and, for example, may be bonded and fixed by an adhesive or the like.

As described above, by stacking the conductive substrate 201 and the conductive substrate 202, the conductive substrate laminate 30 having the meshed wiring can be formed as shown in FIG. 3A.

Here, a method for forming a conductive substrate laminate having meshed wiring has been described using the example in which the two conductive substrates are stacked. However, the method for forming a (stacked) conductive substrate having meshed wiring is not limited to this example. For example, a conductive substrate having meshed wiring may be formed from the conductive substrate 10B shown in FIG. 1B that has the adhesion layers 12A and 12B, the metal layers 13A and 13B, the blackened layers 14A and 14B stacked on the first principal plane 11a, and the second principal plane 1lb of the transparent base material 11, respectively.

Figure 4:
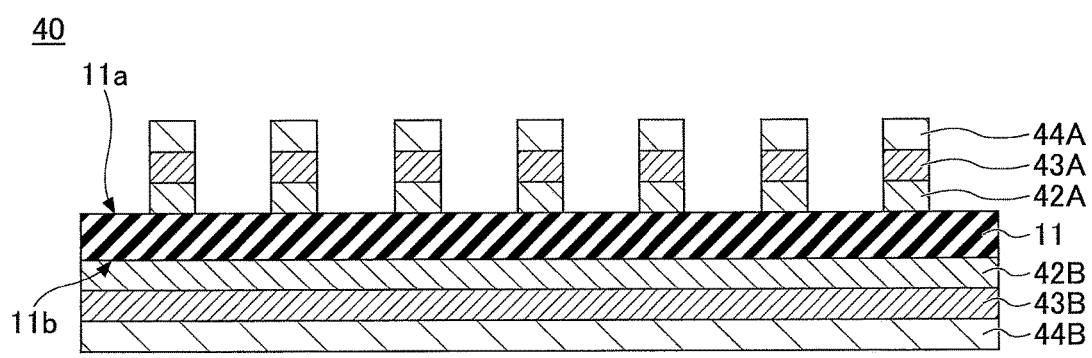
FIG. 4 is a diagram that illustrates a configuration of a conductive substrate having meshed wiring according to an embodiment of the present invention.

In this case, the adhesion layer 12A, the metal layer 13A, and the blackened layer 14A stacked on the side of the first principal plane 11a of the transparent base material 11, are patterned to have a pattern of multiple straight lines parallel with the Y-axis direction in FIG. 1B, namely, the direction vertical to the paper surface. Also, the adhesion layer 12B, the metal layer 13B, and the blackened layer 14B stacked on the side of the first principal plane 11b of the transparent base material 11, are patterned to have a pattern of multiple straight lines parallel with the X-axis direction in FIG. 1B. The patterns may be formed, for example, by etching as described above. Thus, as shown in FIG. 4, a conductive substrate having meshed wiring can be formed that has a patterned metal layer 43A formed on the side of the first principal plane 11a, a patterned metal layer 43B formed on the side of the second principal plane 11b, and the transparent base material 11 in-between.

Note that although FIGS. 3A and 3B illustrates an example that has straight-line-shaped wiring combined to form the meshed wiring (the wiring pattern), the wiring is not limited to this shape, but the wiring may have a discretionary shape to form a wiring pattern. For example, to prevent a moiré (an interference pattern) from being generated with an image on the display, the straight lines forming the meshed wiring pattern may have shapes of lines having serrations (zigzag lines), or any other shapes. This is the same for the conductive substrate shown in FIG. 4.

According to the (stacked) conductive substrate described above, the patterned metal layer has, on its upper surface, the patterned blackened layer placed. Therefore, reflection of light can be prevented on the surface of the patterned metal layer.

Also, by so placing the metal layer, the electrical resistance value can be decreased. Further, by forming the blackened layer by a wet method as described above, it can be manufactured with high productivity.

(Method for Producing Conductive Substrate, and Method for Producing Conductive Substrate Laminate)

Next, a method for producing a conductive substrate according to the embodiment, and a configuration example of a conductive substrate laminate will be described.

A method for producing a conductive substrate according to the embodiment may include the following processes: a metal layer forming process that forms a metal layer on at least one of the surfaces of the transparent base material; and a blackened layer forming process that forms a blackened layer on the metal layer by a wet method. In the following, a method for producing a conductive substrate and a method for producing a conductive substrate laminate will be described according to the embodiment. Note that points other than those described in the following are substantially the same as in the above description of the conductive substrate and the conductive substrate laminate, and hence, their description will be omitted.

A transparent base material used in the metal layer forming process can be prepared in advance. Although the type of the transparent base material to be used is not limited specifically, a resin substrate (a resin film), a glass substrate or the like that transmits visible light may be preferably used as has already been described. The transparent base material may be cut into a discretionary size in advance if necessary.

Next, the metal layer forming process will be described.

It is preferable that the metal layer has a metal thin film layer as has already been described. Also, the metal layer may have a metal thin film layer and a metal plated layer. Therefore, the metal layer forming process may include a process of forming a metal thin film layer, for example, by dry plating. Also, the metal layer forming process may include a process of forming a metal thin film layer by dry plating, and a process of forming a metal plated layer by electroplating as a type of wet plating, using the metal thin film layer as a power feeding layer.

Dry plating used for forming the metal thin film layer is not limited specifically, for example, sputtering, vapor deposition, ion plating, or the like may be preferably used. Especially, sputtering may be further preferably used because the film thickness can be controlled easily.

Conditions for the process of forming a metal plated layer by wet plating, namely, conditions for the process of electric plating are not limited specifically, and conditions for normal use may be adopted. For example, a metal plated layer may be formed by supplying a base material having a metal thin film layer formed, into a metal plating solution in a plating bath, and by controlling the current density and/or the conveyance speed of the base material.

Next, the blackened layer forming process will be described.

In the blackened layer forming process, the blackened layer may be formed by a wet method. By forming the blackened layer by a wet method, the conductive substrate can be manufactured with high productivity, compared to a case where the blackened layer has been formed conventionally only by a dry method.

Also, if the blackened layer is formed as a film conventionally by a dry method, the productivity is low because, for example, after a metal plated layer has been formed as a film by a wet method, an object covered by the film needs to be taken out of a film forming apparatus for the wet method and to be dried, and then, to be set to another apparatus for a dry method. In contrast to this, in the method for producing a conductive substrate according to the embodiment, since the blackened layer is also formed by a wet method, the metal plated layer and the blackened layer can be formed consecutively by an apparatus for a wet method, and the productivity can be increased especially.

Although a method for forming the blackened layer is not specifically limited as long as it a wet method, a method may be considered, for example, that newly forms and stacks a blackened layer by wet plating on the metal layer. In this case, for example, electrolytic plating can be used for wet plating.

Also, as a specific method for forming the blackened layer by a wet method, a method may be considered that forms the blackened layer by applying a blackening process using chemical liquid to the surface of the formed metal layer (a wet process). In other words, the chemical liquid is supplied to the upper surface of the metal layer, to have the metal layer and the chemical liquid react, and to make a part of the metal layer be the blackened layer. A method for supplying the chemical liquid to the upper surface of the metal layer is not limited specifically, for example, a method for having a part of the metal layer immerse in the chemical liquid, or a method for applying or spraying the chemical liquid to the upper surface of the metal layer may be considered.

Although the type of the chemical liquid supplied to the upper surface of the metal layer is not limited specifically, for example, chemical liquid that can sulfurate the metal layer may be used. As the chemical liquid that sulfurates the metal layer, for example, a mixed solution of potassium sulfide or potassium polysulfide, and ammonium chloride may be preferably used.

Also, as a specific method for forming the blackened layer by a wet method, a method may be considered that forms the blackened layer by applying electroless plating to the surface of the formed metal layer.

If the blackened layer is formed by the electroless plating described above in the blackened layer forming process, although a material for forming the blackened layer is not limited specifically, it is preferable that the blackened layer is a layer that contains, for example, tellurium chloride. Also, the blackened layer may a layer that is constituted with tellurium chloride.

By forming the blackened layer by electroless plating, the conductive substrate can be manufactured with high productivity, compared to a case where the blackened layer has been formed conventionally only by a dry method.

In the method for producing a conductive substrate according to the embodiment, an optional process may be further executed in addition to the processes described above.

For example, in a case where an adhesion layer is formed between the transparent base material and the metal layer, an adhesion layer forming process may be executed that forms an adhesion layer on a surface of the transparent base material on which the metal layer is formed. In a case where the adhesion layer forming process is to be executed, the metal layer forming process may be executed after the adhesion layer forming process, and the metal layer forming process may form the metal thin film layer on the adhesion layer by using a base material with which the adhesion layer has been formed on the transparent base material in the process.

As shown in FIG. 1A, the adhesion layer may be formed on at least one of the principal planes of the transparent base material 11, for example, on the first principal plane 11a. Also, as shown in FIG. 1B, the adhesion layers 12A and 12B may be formed on both the first principal plane 11a and the second principal plane 1ib of the transparent base material 11. In a case where the adhesion layers are formed on both the first principal plane 11a and the second principal plane 11b of the transparent base material 11, the adhesion layers are formed on both of the principal planes at the same time. Alternatively, after an adhesion layer has been formed on one of the principal planes, another adhesion layer may be formed on the other principal plane.

The material forming the adhesion layer is not limited specifically, and can be selected discretionarily depending on adhesion force between the transparent base material and the metal layer, a degree of preventing reflection of light on the surface of the metal layer, stability of the environment (for example, humidity and temperature) in which the conductive substrate is used, and the like. Since the materials that are favorably used as materials forming the adhesion layer have already been described, their description is omitted here.

Although a method for forming the adhesion layer as a film is not limited specifically, for example, the film may be formed by dry plating as described above. As the dry plating, for example, sputtering, vapor deposition, ion plating, or the like may be preferably used. Especially, sputtering may be further preferably used because the film thickness can be controlled easily.

Note that if the adhesion layer is to include one or more elements selected among carbon, oxygen, and nitrogen, the elements can be added into the adhesion layer, by adding gas that contains the one or more elements selected among carbon, oxygen, and nitrogen, to the atmosphere used when forming the adhesion layer as a film. For example, if adding carbon into the adhesion layer, carbon monoxide gas or carbon dioxide gas may be added; if adding nitrogen, nitrogen gas may be added; or if adding oxygen, oxygen gas may be added, to the atmosphere used when applying the dry plating.

It is preferable that gas containing one or more elements selected among carbon, oxygen, and nitrogen is added to an inert gas, and to be used as the atmosphere gas for dry plating. The inert gas is not limited specifically; for example, argon may be preferably used.

In a case where the adhesion layer is formed as a film by sputtering, a target to be used may include metal species that constitute the adhesion layer. In a case where the adhesion layer includes an alloy, the alloy may be formed on the surface of an object to be covered by the film, such as the transparent base material or the like, by using each of the metal species included in the adhesion layer as a target, or by using a target of alloy including metal species of the adhesion layer in advance.

By forming the adhesion layer as a film by dry plating as described above, adhesion between the transparent base material and the metal layer can be increased. In addition, since the adhesion layer may include, for example, metal as a principal element, the adhesion with the metal layer can be high. Therefore, by placing the adhesion layer between the transparent base material and the metal layer, delamination of the metal layer can be prevented.

Although the thickness of the adhesion layer is not limited specifically, it is preferable to be, for example, greater than or equal to 3 nm and less than or equal to 50 nm, further preferable greater than or equal to 3 nm and less than or equal to 35 nm, and even further preferable greater than or equal to 3 nm and less than or equal to 33 nm.

The conductive substrate obtained by the method for producing a conductive substrate according to the embodiment can be used for various applications, for example, for a touch panel. When used for various applications, it is preferable that the metal layer and the blackened layer included in the conductive substrate according to the embodiment have patterns. The metal layer and the blackened layer can be patterned, for example, to have desired wiring patterns, and it is preferable that the metal layer and the blackened layer are patterned to have the same pattern.

Note that if the adhesion layer is provided as described above, it is preferable that the adhesion layer is also patterned, and can be patterned to have a desired wiring pattern as done for the metal layer and the like. In this case, it is preferable that the adhesion layer is patterned to have the same pattern as the metal layer and the like.

Therefore, the method for producing a conductive substrate according to the embodiment may include a patterning process for making patterns for the metal layer and the blackened layer. Specific steps of the patterning process are not limited especially, and may be executed by discretionary steps. Note that if the adhesion layer is provided, the adhesion layer may also have a pattern by the patterning process. For example, in the case of the conductive substrate 10A having the adhesion layer 12, the metal layer 13, and the blackened layer 14 stacked on the transparent base material 11 as shown in FIG. 1A, a mask placement process is first executed that places a mask having a desired pattern on the blackened layer 14. Next, an etching process may be executed that supplies etching liquid on the upper surface of the blackened layer 14, namely, on the side on which the mask has been placed.

The etching liquid used in the etching process is not limited specifically, and may be selected discretionarily depending on materials that constitute the metal layer, the blackened layer, and the adhesion layer if provided. For example, the etching liquid may be changed for each of the layers, or the same etching liquid may be used for etching the metal layer, the blackened layer, and the adhesion layer if provided at the same time.

A pattern formed by the etching process is not specifically limited. For example, patterning may be applied to the metal layer, the blackened layer, and the adhesion layer if necessary, to form patterns of multiple straight lines. In a case where the patterning is applied to form the patterns of multiple straight lines, for example, as shown in FIG. 2A and FIG. 2B, the patterned adhesion layer 22, metal layer 23, and blackened layer 24 have patterns of lines that are parallel with and separated from each other.

Also, the patterning process may be executed for the conductive substrate 10B that have the adhesion layers 12A and 12B, the metal layers 13A and 13B, and the blackened layers 14A and 14B stacked on the first principal plane 11a, and the second principal plane 11b of the transparent base material 11, respectively, as shown in FIG. 1B to form patterns. In this case, for example, the mask placement process may be executed to place a mask having a desired pattern on the blackened layers 14A and 14B. Next, the etching process may be executed that supplies etching liquid on the upper surfaces of the blackened layers 14A and 14B, namely, on the sides on which the mask has been placed.

In the etching process, for example, the adhesion layer 12A, the metal layer 13A, and the blackened layer 14A stacked on the side of the first principal plane 11a of the transparent base material 11, can be patterned to have a pattern of multiple straight lines parallel with the Y-axis direction in FIG. 1B, namely, the direction vertical to the paper surface. Also, the adhesion layer 12B, the metal layer 13B, and the blackened layer 14B stacked on the side of the first principal plane 1lb of the transparent base material 11, can be patterned to have a pattern of multiple straight lines parallel with the X-axis direction in FIG. 1B. Thus, as shown in FIG. 4, the conductive substrate having meshed wiring can be formed that has the patterned metal layer 43A formed on the side of the first principal plane 11a, the patterned metal layer 43B formed on the side of the second principal plane 11b, and the transparent base material 11 in-between.

Note that the patterning process may be executed before the blackened layer forming process described above. As described above, in the method for producing a conductive substrate according to the embodiment, as a method for forming the blackened layer, electroless plating, a method that blackens the surface of the formed metal layer by chemical liquid (a wet process) or the like may be used. According to these methods, it is not necessary to supply a current to the metal layer when the blackened layer is formed, the blackened layer may be formed after having the metal layer, and the adhesion layer if necessary, patterned. Especially, by executing the blackened layer forming process after having executed the patterning process, the blackened layer can be formed not only on the patterned upper surface of the metal layer, but also on the side surfaces. Therefore, reflection on the surfaces of the metal layer can be prevented especially, and this is preferable.

In a case where the patterning process is executed before the blackened layer forming process, the mask placement process described above places the mask having the desired pattern on the upper surface of the metal layer. Also, the etching process supplies the etching liquid to the upper surface of the metal layer.

Further, a conductive substrate laminate can be manufactured by stacking multiple conductive substrates described so far. A method for producing a conductive substrate laminate may include a stacking process that stacks multiple conductive substrates obtained by the method for producing a conductive substrate described above.

The stacking process may stack multiple patterned conductive substrates, for example, shown in FIG. 2A and FIG. 2B. Specifically, as shown in FIG. 3A and FIG. 3B, the stacking process may be executed so that the first principal plane 111a of the transparent base material 111 of the conductive substrate 201 faces the second principal plane 112b of the transparent base material 112 of the conductive substrate 202.

After the stacking, the two conductive substrates 201 and 202 may be fixed by for example, an adhesive or the like.

Note that the stacking process may be executed so that the second principal plane 111b of the transparent base material 111 of the conductive substrate 201 faces the second principal plane 112b of the transparent base material 112 of the conductive substrate 202 in the stack.

In a case where a conductive substrate laminate having meshed wiring is formed, as shown in FIG. 3A and FIG. 3B, the stacking process can execute stacking so as to have the patterned metal layer 231 of the conductive substrate 201 cross the patterned metal layer 232 of the conductive substrate 202.

Although the example in FIG. 3A and FIG. 3B has the meshed wiring (a wiring pattern) formed by combining the patterned metal layers having the patterns of straight lines, the patterns are not limited to those. The wiring forming the patterns, namely, the shape of a patterned metal layer may have a discretionary shape. For example, to prevent a moiré (an interference pattern) from being generated with an image on the display, the straight likes forming the meshed wiring pattern may have shapes of lines having serrations (zigzag lines), or any other shapes.

Thus, according to the method for producing a conductive substrate and the method for producing a conductive substrate laminate according to the embodiment, by providing the metal layer, the electrical resistance value can be decreased. Also, by providing the blackened layer, reflection of light can be prevented on the surface of the patterned metal layer. Further, by forming the blackened layer by a wet method, it can be manufactured with high productivity.

APPLICATION EXAMPLES

In the following, although specific application examples will be described along with comparative examples, the present invention is not limited to these application examples.

(Evaluation Method)

First, an evaluation method for an obtained conductive substrate will be described.

(Specular Reflectance)

Measurement was executed by using an ultraviolet-visible spectrophotometer (manufacture by Shimadzu corporation, model type: UV-2550) having a reflectance measure unit installed.

The specular reflectance was measured for each of the following conductive substrates produced by the following application examples and comparative examples, by illuminating light having a wavelength greater than or equal to 400 nm and less than or equal to 800 nm, on the blackened layer surface of the conductive substrate, with the incident angle 5° and the light receiving angle 5°, and changing the wavelength by the interval of 1 nm, and the average value was taken as the specular reflectance.

Then, a sample having the specular reflectance less than 10% was evaluated as excellent (denoted by double circle), less than 30% was evaluated as good (denoted by single circle), and greater than or equal to 30% was evaluated as bad (denoted by X).

(Surface Resistivity)

The surface resistivity of each of the conductive substrates produced by the following application examples and comparative examples was measured by using a low-resistivity meter (manufactured by Dia Instruments Co., Ltd., model number: Loresta EP MCP-T360). The measurement was executed by four-probe probing, and having the probes contact the blackened layer.

Then, a sample having the surface resistivity less than 0.20 Ω/□ was evaluated as good (denoted by single circle), and greater than or equal to 0.20 Ω/□ was evaluated as bad (denoted by X).

(Conditions for Producing Samples)

Conductive substrates were produced under conditions describe in the following as the application examples and the comparative examples, and evaluated by the evaluation method described above.

Application example 1

(Adhesion Layer Forming Process)

An adhesion layer was formed as a film on one of the principal planes of a transparent base material made of polyethylene terephthalate resin (PET), having the length 500 mm, the width 500 mm, and the thickness 50 μm. Note that the total transmittance was evaluated for the transparent base material made of polyethylene terephthalate resin used as a transparent base material, by a method specified in JIS K 7361-1, and the obtained result was 97%.

In the adhesion layer forming process, Ni—Cu alloy layer that contains oxygen was formed as a film as the adhesion layer, by a sputtering apparatus having a target of Ni—Cu (17% by weight) alloy attached. In the following, steps of forming the adhesion layer as a film will be described.

The transparent base material described above that had been heated to 60° C. in advance to remove water, was installed in a chamber of the sputtering apparatus.

Next, the chamber was exhausted to $1 \times 10^{-3}$ Pa, and then, argon gas and oxygen gas were introduced to make the pressure in the chamber 1.3 Pa. Note that at this moment, the atmosphere in the chamber includes 30% of oxygen by volume, and argon for the rest.

Then, electric power was supplied to the target in this atmosphere, and an adhesion layer was formed as a film on one of the principal planes of the transparent base material, to have the thickness of 20 nm.

(Metal Layer Forming Process)

In the metal layer forming process, a metal thin film layer forming process, and a metal plated layer forming process were executed.

First, the metal thin film layer forming process will be described.

In the metal thin film layer forming process, as a base material, the transparent base material having the adhesion layer formed as a film by the adhesion layer forming process was used, and a copper thin film layer was formed on the adhesion layer as the metal thin film layer.

The metal thin film layer was formed as a film by the sputtering apparatus, which is similar to the case of the adhesion layer except that copper was used as the target, and the chamber having the base material set was exhausted, and then, argon gas was supplied to obtain the atmosphere of argon.

The copper thin film layer as the metal thin film layer was formed as a film to have the film thickness of 150 nm.

Next, in the metal plated layer forming process, a copper plated layer was formed as the metal plated layer. The copper plated layer was formed as a film by electrolytic plating so that the thickness of the copper plated layer is 2.0 µm.

(Blackened Layer Forming Process)

The transparent base material having the adhesion layer and the metal layer formed, was immersed into a mixed solution of potassium sulfide having the concentration 3.0 g/liter, and ammonium chloride having the concentration 9.0 g/liter, at 25° C. for 120 seconds, to sulfurate the surface of the metal layer. Note that the time of the immersion into the mixed solution of potassium sulfide solution and ammonium chloride solution may be referred to as the sulfuration time in the following. In this way, the blackened layer was formed on the upper surface of the metal layer, namely, the surface of the metal layer that is opposite to the other surface facing the adhesion layer.

The specular reflectance and the surface resistivity described above were evaluated for the obtained conductive substrate. The result is shown in Table 1.

Application Example 2

A conductive substrate was produced in virtually the same way as in the application example 1 except that the sulfuration time was set to 60 second in the blackened layer forming process.

The specular reflectance and the surface resistivity described above were evaluated for the obtained conductive substrate. The result is shown in Table 1.

Comparative Example 1

A conductive substrate was produced in virtually the same way as in the application example 1 except that the blackened layer forming process was not executed.

The specular reflectance and the surface resistivity described above were evaluated for the obtained conductive substrate. The result is shown in Table 1.

Comparative Example 2

A conductive substrate was produced in virtually the same way as in the application example 1 except that the sulfuration time was set to 300 seconds in the second sulfuration process.

The specular reflectance and the surface resistivity described above were evaluated for the obtained conductive substrate. The result is shown in Table 1.

TABLE 1

| | SULFURATION TIME (SECOND) | SPECULAR REFLECTANCE | | SURFACE RESISTIVITY | |
|---|---|---|---|---|---|
| | | (%) | EVALUATION | ($\Omega/\square$) | EVALUATION |
| APPLICATION EXAMPLE 1 | 120 | 7.0 | ◎ | 0.10 | ○ |
| APPLICATION EXAMPLE 2 | 60 | 29.7 | ○ | 0.07 | ○ |
| COMPARATIVE EXAMPLE 1 | 0 | 63.0 | X | 0.02 | ○ |
| COMPARATIVE EXAMPLE 2 | 300 | 0.3 | ◎ | 0.25 | X |

We confirmed from the results in Table 1 that in the application examples 1 and 2, the evaluation of the specular reflectance was excellent or good, the evaluation of the surface resistivity was good, and the conductive substrates were obtained that can prevent reflection on the surface of the metal layer thanks to providing the metal layer, and the electrical resistance value was small. Also, since the blackened layer was formed by a wet method in the application examples 1 and 2, we confirmed that the conductive substrates can be manufactured with high productivity.

In contrast to this, since the blackened layer was not formed in the comparative example 1, we confirmed that the specular reflectance was 63.0%, which is very high, and reflection on the surface of the metal layer was not prevented.

Also, in the comparative example 2, the specular reflectance was 0.3%, which is very low, and the evaluation was excellent, but the surface resistivity was 0.25 $\Omega/\square$, confirmed to be a very high surface resistivity. This is because the sulfuration time was long in the blackened layer forming process, and the entire metal layer was changed into the blackened layer.

Application Example 3

An adhesion layer and a metal layer were formed on the transparent base material in the same way as in the application example 1, and then, a blackened layer was formed by the following step.

(Blackened Layer Forming Process)

The transparent base material having the adhesion layer and the metal layer formed was immersed into an electroless plating solution of tellurium chloride, at 30° C. for 120 seconds, to precipitate tellurium chloride on the surface of the metal layer. In this way, the blackened layer was formed on the upper surface of the metal layer, namely, the surface of the metal layer that is opposite to the other surface facing the adhesion layer.

The specular reflectance and the surface resistivity described above were evaluated for the obtained conductive substrate. The result is shown in Table 2.

Application Example 4

A conductive substrate was produced in virtually the same way as in the application example 3 except that the time of immersion into the electroless plating solution was set to 30 seconds in the blackened layer forming process.

The specular reflectance and the surface resistivity described above were evaluated for the obtained conductive substrate. The result is shown in Table 2.

Comparative Example 3

A conductive substrate was produced in virtually the same way as in the application example 3 except that the blackened layer forming process was not executed.

The specular reflectance and the surface resistivity described above were evaluated for the obtained conductive substrate. The result is shown in Table 2.

TABLE 2

|  | IMMERSION TIME (SECOND) | SPECULAR REFLECTANCE | | SURFACE RESISTIVITY | |
| --- | --- | --- | --- | --- | --- |
|  |  | (%) | EVALUATION | ($\Omega/\square$) | EVALUATION |
| APPLICATION EXAMPLE 3 | 120 | 0.2 | ◎ | 0.03 | ○ |
| APPLICATION EXAMPLE 4 | 30 | 8.0 | ◎ | 0.03 | ○ |
| COMPARATIVE EXAMPLE 3 | 0 | 63.0 | X | 0.02 | ○ |

We confirmed from the results in Table 2 that in the application examples 3 and 4, the evaluation of the specular reflectance was excellent, the evaluation of the surface resistivity was good, and the conductive substrates were obtained that can prevent reflection on the surface of the metal layer thanks to providing the metal layer, and the electrical resistance value was small. Also, since the blackened layer was formed by the electroless plating in the application examples 3 and 4, we confirmed that the conductive substrates can be manufactured with high productivity.

In contrast to this, since the blackened layer was not formed in the comparative example 3, we confirmed that the specular reflectance was 63.0%, which is very high, and reflection on the surface of the metal layer was not prevented.

The foregoing describes a conductive substrate, a conductive substrate laminate, a method for producing a conductive substrate, and a method for producing a conductive substrate laminate according to the embodiments and the application examples. Note that the present invention is not limited to the above embodiments and application examples. Various transformations and alterations can be made within the scope of the present invention described in the claims.

The present application is based on and claims the benefit of priority of Japanese Priority Application No. 2014-017974 filed on January 31, 2014 with the Japanese Patent Office, and Japanese Priority Application No. 2014-176208 filed on Aug. 29, 2014 with the Japanese Patent Office, the entire contents of which are hereby incorporated by reference.

DESCRIPTION OF REFERENCE SYMBOLS 10A, 10B, 20, 201, 202, 40 conductive substrate
11, 111, 112 transparent base material
111a, 111a, 112a first principal plane
11b, 111b, 112b second principal plane
12, 12A, 12B, 22, 221, 222, 42A, 42B adhesion layer
13, 13A, 13B, 23, 231, 232, 43A, 43B metal layer
14, 14A, 14B, 24, 241, 242, 44A, 44B blackened layer
30 conductive substrate laminate

The invention claimed is:

1. A conductive substrate, comprising:
a transparent base material;
an adhesion layer; wherein the adhesive layer comprises an Ni—Cu alloy and oxygen, and a first surface of the adhesion layer formed on at least one of surfaces of the transparent base material;
a metal layer; wherein a first surface of the metal layer formed on a second surface of the adhesion layer;
a blackened layer formed on a second surface of the metal layer by a wet method.

2. The conductive substrate as claimed in claim 1, wherein the metal layer and the blackened layer have patterns formed.

3. A conductive substrate laminate, comprising:
a plurality of the conductive substrates as claimed in claim 1 that are stacked.

4. A method for producing a conductive substrate, the method comprising:
a metal layer forming process for forming a metal layer on at least one of surfaces of a transparent base material;
a blackened layer forming process for forming a blackened layer on the metal layer by a wet method; and
an adhesion layer forming process for forming an adhesion layer on at least one of the surfaces of the transparent base material, by dry plating, and formed between the transparent base material and the metal layer, wherein the adhesive layer comprises an Ni—Cu alloy and oxygen.

5. The method for producing the conductive substrate as claimed in claim 4, the method further comprising:
a patterning process for forming patterns on the metal layer and the blackened layer.

6. A method for producing a conductive substrate laminate, the method comprising:
a stacking process for stacking a plurality of the conductive substrates that have been obtained by the method for producing the conductive substrate as claimed in claim 4.

7. A conductive substrate laminate, comprising:
a plurality of the conductive substrates as claimed in claim 2 that are stacked.

8. A method for producing a conductive substrate laminate, the method comprising:
a stacking process for stacking a plurality of the conductive substrates that have been obtained by the method for producing the conductive substrate as claimed in claim 5.

* * * * *